US 11,538,697 B2

(12) United States Patent
Nam et al.

(10) Patent No.: US 11,538,697 B2
(45) Date of Patent: Dec. 27, 2022

(54) SUBSTRATE PROCESSING APPARATUS

(71) Applicant: SAMSUNG ELECTRONICS CO., LTD., Suwon-si (KR)

(72) Inventors: Sang Ki Nam, Seongnam-si (KR); Jang-Yeob Lee, Hwaseong-si (KR); Sungyeol Kim, Yongin-si (KR); Sunghyup Kim, Hwaseong-si (KR); Soonam Park, Seongnam-si (KR); Siqing Lu, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 301 days.

(21) Appl. No.: 17/016,881

(22) Filed: Sep. 10, 2020

(65) Prior Publication Data

US 2021/0074558 A1 Mar. 11, 2021

(30) Foreign Application Priority Data

Sep. 11, 2019 (KR) ........................ 10-2019-0112913

(51) Int. Cl.
H01L 21/67 (2006.01)
H01J 37/32 (2006.01)
H01L 21/3213 (2006.01)

(52) U.S. Cl.
CPC .. H01L 21/67086 (2013.01); H01J 37/32568 (2013.01); H01J 37/32715 (2013.01);
(Continued)

(58) Field of Classification Search
CPC .......... H01L 21/67086; H01L 21/32139; H01J 37/32568; H01J 37/32715;
(Continued)

(56) References Cited

U.S. PATENT DOCUMENTS 5,204,506 A 4/1993 Asmus et al.
7,378,031 B2 5/2008 Mizuno et al.
(Continued)

FOREIGN PATENT DOCUMENTS

JP 2001237212 A * 8/2001
JP 2008-135286 A 6/2008
(Continued)

OTHER PUBLICATIONS

Horikoshi et al. "In-liquid plasma: a novel tool in the fabrication of nanomaterials and in the treatment of wastewaters" Oct. 6, 2017, RSC Adv., 7, p. 47196-47218. (Year: 2017).*

Primary Examiner — Karla A Moore
Assistant Examiner — Margaret Klunk
(74) Attorney, Agent, or Firm — Sughrue Mion, PLLC

(57) ABSTRACT

A substrate processing apparatus, including a processing chamber including a first internal space and a second internal space arranged in a vertical direction, the first internal space being configured to receive process gas to generate plasma; an induction electrode configured to divide the processing chamber, and having a plurality of through-holes arranged to connect the first internal space and the second internal space, wherein the plurality of through-holes are configured to induce an ion beam extracted from ions included in the plasma generated in the first internal space; a radical supply located in the second internal space, and including a reservoir configured to receive chemical liquid in which an object to be processed is immersed, and a lower electrode configured to apply nanopulses to the reservoir to generate radicals from the chemical liquid; and a chemical liquid supply configured to supply the chemical liquid to the reservoir.

20 Claims, 13 Drawing Sheets

(52) U.S. Cl.
CPC ... *H01J 37/32899* (2013.01); *H01J 37/32082* (2013.01); *H01J 2237/2007* (2013.01); *H01J 2237/334* (2013.01); *H01L 21/32139* (2013.01)

(58) Field of Classification Search
CPC ........... H01J 37/32899; H01J 37/32082; H01J 2237/2007; H01J 2237/334
See application file for complete search history.

(56) References Cited

U.S. PATENT DOCUMENTS

| | | | |
|---|---|---|---|
| 8,163,641 B2 | 4/2012 | Gu et al. | |
| 9,044,781 B2 | 6/2015 | Botman et al. | |
| 9,799,494 B2 | 10/2017 | Chen et al. | |
| 10,134,605 B2 | 11/2018 | Guha | |
| 2004/0003828 A1* | 1/2004 | Jackson | C23C 16/0227 257/E21.228 |
| 2005/0023245 A1* | 2/2005 | Korenev | C08J 7/12 216/62 |
| 2007/0034601 A1 | 2/2007 | Goto et al. | |
| 2008/0210664 A1* | 9/2008 | Uenishi | C23G 5/00 216/67 |
| 2010/0015810 A1* | 1/2010 | Yanagisawa | H01L 21/31111 438/746 |
| 2011/0229656 A1* | 9/2011 | Shibata | H01J 37/32357 118/723 E |
| 2012/0160692 A1 | 6/2012 | Seok et al. | |
| 2013/0279533 A1* | 10/2013 | Forbes Jones | C22B 9/04 373/22 |
| 2015/0102255 A1 | 4/2015 | Imai et al. | |
| 2015/0225264 A1 | 8/2015 | Fujikane et al. | |
| 2015/0307370 A1 | 10/2015 | Kang | |
| 2016/0120013 A1 | 4/2016 | Imai | |
| 2019/0035636 A1* | 1/2019 | Yoshimizu | H01J 37/32 |
| 2019/0322551 A1* | 10/2019 | Asami | H05H 1/46 |
| 2020/0035515 A1* | 1/2020 | Yoo | H01J 37/32559 |
| 2020/0407247 A1* | 12/2020 | Horikoshi | H05H 1/24 |
| 2021/0265130 A1* | 8/2021 | Kaneko | G01N 1/32 |

FOREIGN PATENT DOCUMENTS

| | | | |
|---|---|---|---|
| JP | 2010199125 A | * | 9/2010 |
| JP | 5148563 A | | 2/2013 |
| JP | 2014127705 A | * | 7/2014 |

* cited by examiner

SUBSTRATE PROCESSING APPARATUS

CROSS-REFERENCE TO THE RELATED APPLICATION

This application is based on and claims priority under 35 U.S.C. § 119 to Korean Patent Application No. 10-2019-0112913 filed on Sep. 11, 2019 in the Korean Intellectual Property Office, the disclosure of which is incorporated by reference herein in its entirety.

BACKGROUND

The disclosure relates to a substrate processing apparatus.

Semiconductor devices may be manufactured by a plurality of unit processes including a thin film deposition process and a dry or wet etching process. In the dry etching process, a plasma etching operation may mainly be used in a chamber in which a plasma reaction is predominantly induced by an electric field. The dry etching process may have an advantage that an anisotropic etching reaction is possible. However, an etching speed of the dry etching process may be relatively slower than that of the wet etching process, and etching by-products of the dry etching process may be accumulated on a surface of an object to be etched. Meanwhile, the wet etching process may have advantages that an etching speed of the wet etching process may be relatively faster than that of the dry etching process, and etching by-products therefrom may be easily removed from a surface of the object to be etched. However, an undercut may unnecessarily occur due to an isotropic etching reaction which may be used in the wet etching process.

SUMMARY

According to embodiments, a substrate processing apparatus includes a processing chamber including a first internal space and a second internal space arranged in a vertical direction with respect to the first internal space, wherein the first internal space is configured to receive process gas to generate plasma; an induction electrode configured to divide the processing chamber into the first internal space and the second internal space, and having a plurality of through-holes arranged to connect the first internal space and the second internal space, wherein the plurality of through-holes are configured to induce an ion beam extracted from ions included in the plasma generated in the first internal space; a radical supply located in the second internal space, and including a reservoir configured to receive chemical liquid in which an object to be processed is immersed, and a lower electrode configured to apply nanopulses to the reservoir to generate radicals from the chemical liquid; and a chemical liquid supply configured to supply the chemical liquid to the reservoir.

According to embodiments, a substrate processing apparatus includes a processing chamber including a first internal space and a second internal space disposed below the first internal space, wherein the first internal space is configured to generate plasma; an ion beam supply including an induction electrode disposed to divide the processing chamber into the first internal space and the second internal space, wherein the induction electrode includes a plurality of through-holes configured to induce an ion beam extracted from the plasma to irradiate the second internal space; and a radical supply including a reservoir disposed in the second internal space and configured to receive chemical liquid, and a lower electrode configured to apply nanopulses to the reservoir to convert the chemical liquid into an in-liquid plasma state.

According to embodiments, a substrate processing apparatus includes a plasma generator configured to generate plasma in a processing chamber; an ion beam supply configured to extract an ion beam from the plasma in the processing chamber; and a radical supply configured to; apply nanopulses to a chemical liquid in which an object is immersed to convert the chemical liquid into an in-liquid plasma state containing ions and radicals, position a reservoir configured to receive the chemical liquid to face the ion beam supply, and impart an etching directivity for the radicals to perform an anisotropic etching reaction of the object in an extraction direction of the ion beam.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Embodiments provide a substrate processing apparatus capable of performing an etching process having combined aspects of the dry etching process and the wet etching process.

Hereinafter, example embodiment will be described with reference to the accompanying drawings.

Referring to FIGS. 1 to 4, a substrate processing apparatus 1 according to embodiments will be described.

Figure 1:
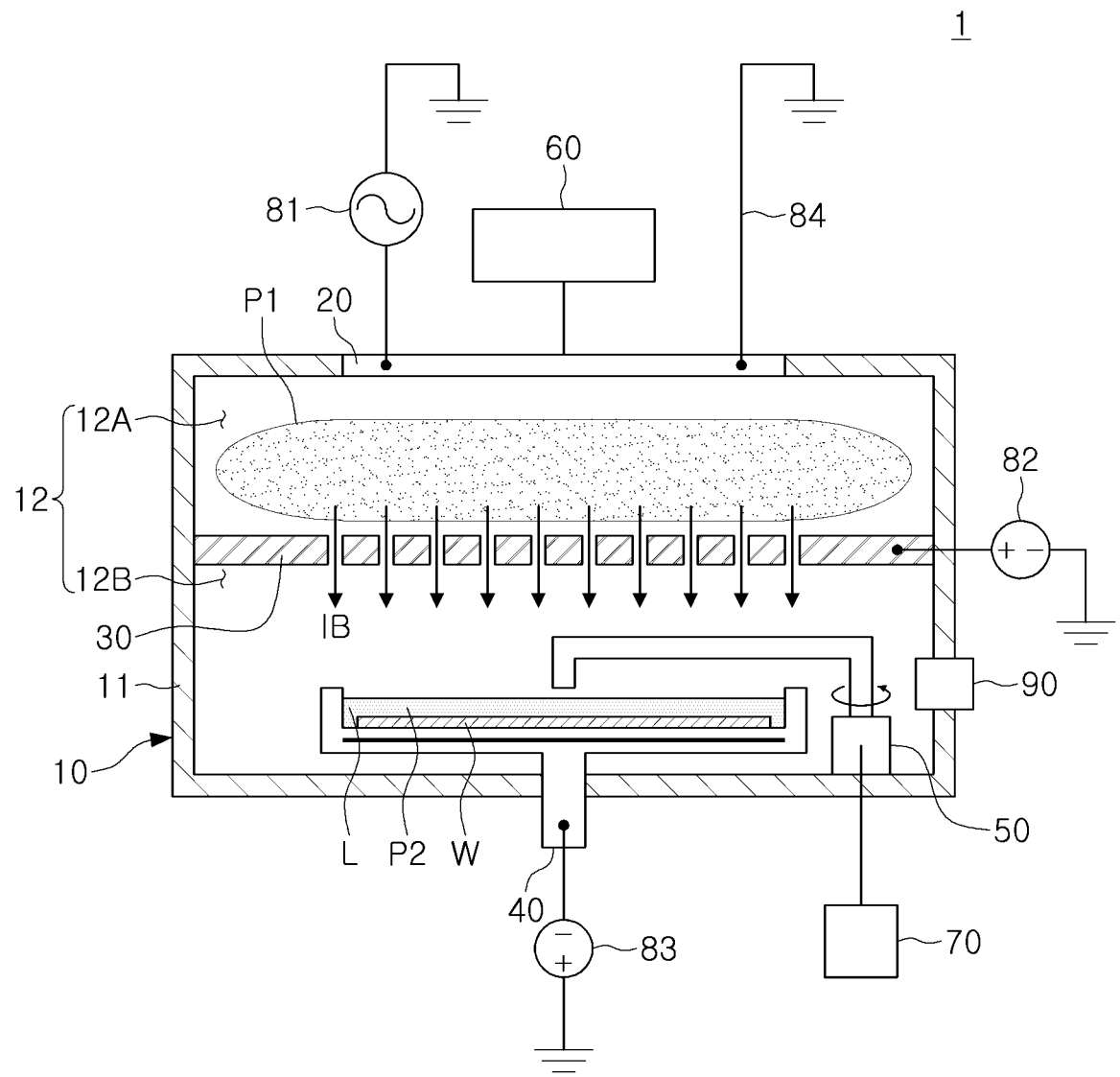
FIG. 1 is a view schematically illustrating a substrate processing apparatus according to embodiments.

Referring to FIG. 1, a substrate processing apparatus 1 according to embodiments may include a processing chamber 10 having an internal space 12 formed by an external wall 11, an upper electrode 20, an induction electrode 30, and a lower electrode 40. In addition, the substrate processing apparatus 1 may further include a chemical liquid supply unit 50 for supplying chemical liquid L to the lower electrode 40, a first power supply unit 81, a second power supply unit 82, and a third power supply unit 83. A wafer W may be a semiconductor substrate including an etching layer, and the substrate processing apparatus 1 may be an apparatus for etching an etching layer on a semiconductor substrate. In embodiments, the etching layer may include a metal layer made of a material including copper (Cu).

The processing chamber 10 may serve as a housing forming the internal space 12 defined by the external wall 11. The internal space 12 may be used to perform an etching process of generating plasma P1 in supplied process gas to process the wafer W, an object to be processed. The external wall 11 may be made of a material having excellent wear resistance and corrosion resistance. The processing chamber 10 may maintain the internal space 12 in a sealed state or a vacuum state in a plasma processing process, for example, an etching process. In a region of the external wall 11, a pump 90 for discharging gas in the internal space 12 may be disposed.

The internal space 12 may be divided into a first internal space 12A and a second internal space 12B, arranged in a vertical direction. The first internal space 12A and the second internal space 12B may be divided by the induction electrode 30. The first internal space 12A may be disposed in an upper portion of the internal space 12, and the second internal space 12B may be disposed below the first internal space 12A in the vertical direction. Process gas may be supplied only into the first internal space 12A.

The first internal space 12A may be used as a space for generating the plasma P1 in the process gas supplied from a process gas source 60 to form an ion beam IB. The second internal space 12B may be used as a space for converting the chemical liquid L in which the wafer W is immersed into an in-liquid plasma P2 state, and irradiating the ion beam IB formed by the plasma P1 to etch the wafer W.

The upper electrode 20 may be disposed above the first internal space 12A interposed with the induction electrode 30 therebetween to face the lower electrode 40. The upper electrode 20 and the lower electrode 40 may serve as an ion beam supply unit supplying the ion beam IB. The upper electrode 20 may be a shower head distributing the process gas into the processing chamber 10. According to embodiments, the upper electrode 20 may be disposed on a side surface of the first internal space 12A. The upper electrode 20 may be connected to the process gas source 60 for supplying the process gas. According to embodiments, the process gas source 60 may be disposed above the processing chamber 10, and may be spaced apart from and connected to the upper electrode 20. Various kinds of gases for generating the ion beam IB may be supplied as the process gas. In embodiments, the process gas may be hydrogen chloride (HCl) gas.

The upper electrode 20 may receive RF power through the first power supply unit 81 to form a high frequency electric field in the first internal space 12A. The process gas supplied to the first internal space 12A of the processing chamber 10 may be excited to a plasma P1 state by the high frequency electric field. When heat is added to the gaseous material, each atom may be broken into electrons and cations, to be changed into a plasma state, a fourth state. The plasma may be a state in which charged particles and neutral particles are gathered. Since a density of negatively charged particles may be almost equal to a density of positively charged particles, the plasma may be a macroscopically neutral material. In this case, the charged particles may include electrons and ions, and the neutral particles may include radicals. The plasma may be downstream to generate a flow from the first internal space 12A to the second internal space 12B in a downward direction. In embodiments, the process gas may be hydrogen chloride (HCl) gas, and the plasma (P1) may include a chlorine ion (Cl$^-$).

The induction electrode 30 may be disposed below the upper electrode 20 to extract an ion beam IB having a predetermined polarity from the plasma P1. The induction electrode 30 may be a grid unit including at least one grid. In embodiments, a case in which the grid unit includes one grid will be described as an example.

Figure 3:
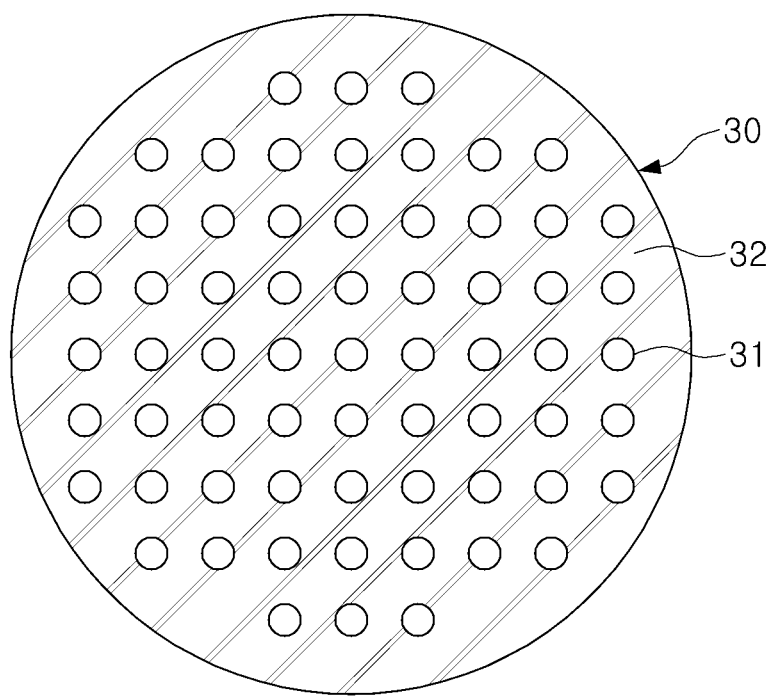
FIG. 3 is a plan view illustrating the induction electrode of FIG. 1 according to embodiments.

As illustrated in FIGS. 1 and 3, a grid 32 of the induction electrode 30 may have a cross-sectional area substantially the same as an internal cross-sectional area of the processing chamber 10. The grid 32 may be made of a conductor. For example, the grid 32 may include one of or any combination of materials such as tungsten, aluminum, copper, molybdenum, stainless steel, or carbon. In the grid 32, a plurality of through-holes 31 may be formed in a thickness direction to induce the ion beam IB, thereby imparting or accelerating directivity. The through-hole 31 may have a shape of a circular hole or slit that may be small enough to prevent the plasma P1 from leaking out. The induction electrode 30 may receive direct current powers having different polarities and magnitudes from the upper electrode 20 from the second power supply unit 82, to form an electric field. To this end, a ground electrode 84 may be connected to the upper electrode 20. In addition, the induction electrode 30 may have a different polarity from the ions of the plasma P1, to induce and accelerate the ion beam IB extracted from the plasma P1 toward the induction electrode 30. In embodiments, the plasma P1 may include a negatively-charged chlorine ion (Cl$^-$), and the induction electrode 30 may have a positive (+) polarity to induce the chlorine ion (Cl$^-$) in a direction facing the induction electrode 30. The ion beam IB extracted from the plasma P1 may pass through the through-hole 31 of the induction electrode 30 to be irradiated to the lower electrode 40.

Figure 2:
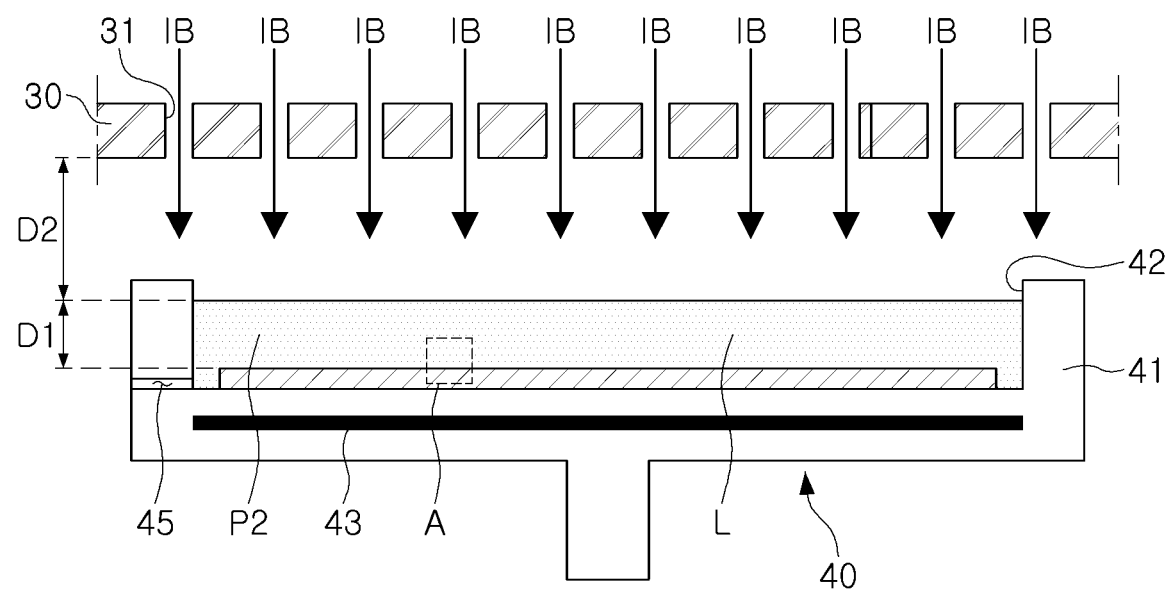
FIG. 2 is a view illustrating an etching process using the induction electrode and the lower electrode of FIG. 1 according to embodiments.

Referring to FIGS. 1 and 2, the lower electrode 40 may be disposed in a central portion of the second internal space 12B. The lower electrode 40 may be a chuck for supporting the wafer W, and a reservoir 42 in which the chemical liquid L in which the wafer W is immersed is received may be formed in a central region of a body 41.

The reservoir 42 may be provided to have a volume large enough to receive the wafer W, and may have a flat lower surface to allow the wafer W to be stably located. The reservoir 42 may be provided to have a depth such that the wafer W is completely immersed in the chemical liquid L. A drainage passage 45 for draining the received chemical liquid L may be provided in a region of the reservoir 42, and may be used to discharge the processed chemical liquid L.

In addition, a level controller for finely adjusting a level of the chemical liquid L may be disposed on the reservoir 42. The level controller may control a depth D1 in which an upper surface of the wafer W is immersed, by adjusting a volume of the chemical liquid L. The level controller may include a heater, a nozzle, and the like, to lower or increase the level of the chemical liquid L. Since the chemical liquid L received in the reservoir 42 may be in an in-liquid plasma state, a transmittance of the ion beam IB irradiated from an upper side may vary, depending on the depth D1 in which the wafer W is immersed. In embodiments, the transmittance of the ion beam IB may be controlled by adjusting the depth D1 in which the wafer W is immersed. Therefore, effects of the ion beam IB acting on the chemical liquid L may be controlled. In embodiments, a heater 43 for heating the chemical liquid L may be disposed below the reservoir 42, and may heat the chemical liquid L to accelerate vaporization on a surface of the chemical liquid L. Therefore, a level of the chemical liquid L may be finely lowered.

In addition, according to embodiments, a nozzle for additionally supplying the chemical liquid L to finely increase the level of the chemical liquid L may be disposed on the reservoir 42.

The lower electrode 40 may receive a direct current power of different polarity from the induction electrode 30 from the third power supply unit 83. The third power supply unit 83 may supply nanopulses having a pulse width in a nanometer unit. The third power supply unit 83 may be an alternating current power source, a direct current power source, a radio frequency source, or a microwave source.

The lower electrode 40 may act as a radical supply unit for supplying radicals R by applying nanopulses to the received chemical liquid L to convert the chemical liquid L into in-liquid plasma. Radicals may refer to a substance formed when a reaction occurs by stimuli such as light, heat, or electricity, and a substance that is highly reactive when formed into an atom or compound state having unpaired electrons. Therefore, the radicals may not remain stable, and may exist for a relatively short life time and then disappear. The radicals may be highly reactive, and may cause decomposition reactions of organic and inorganic matters. In-liquid plasma may occur when nanopulses having a pulse width in a nanometer unit are applied to liquid to excite the liquid into plasma. In embodiments, the nanopulses may have a period of 0.01 kHz to 100 kHz, a pulse width of applied nanopulses may be several tens of nanoseconds or less, and a pulse amplitude of the nanopulses may be 13 kV to 20 kV.

Figure 5:
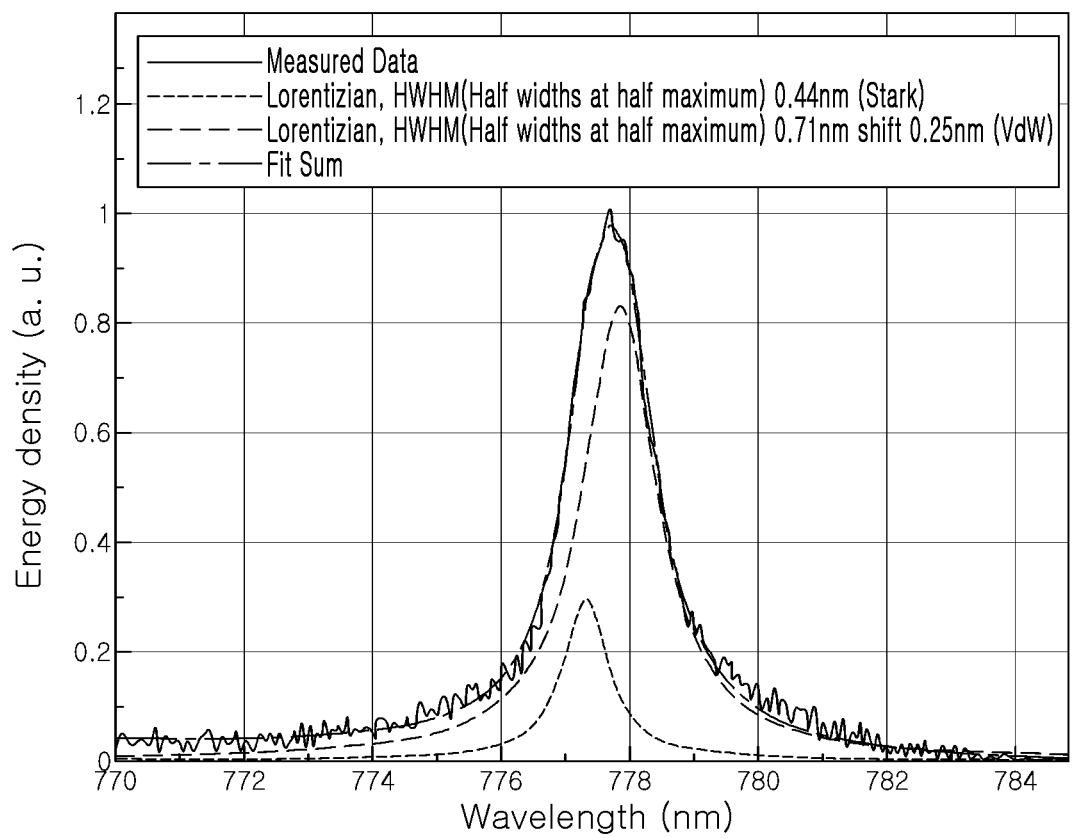
FIGS. 5 and 6 are graphs illustrating etching effects of a substrate processing apparatus according to embodiments.
Figure 6:
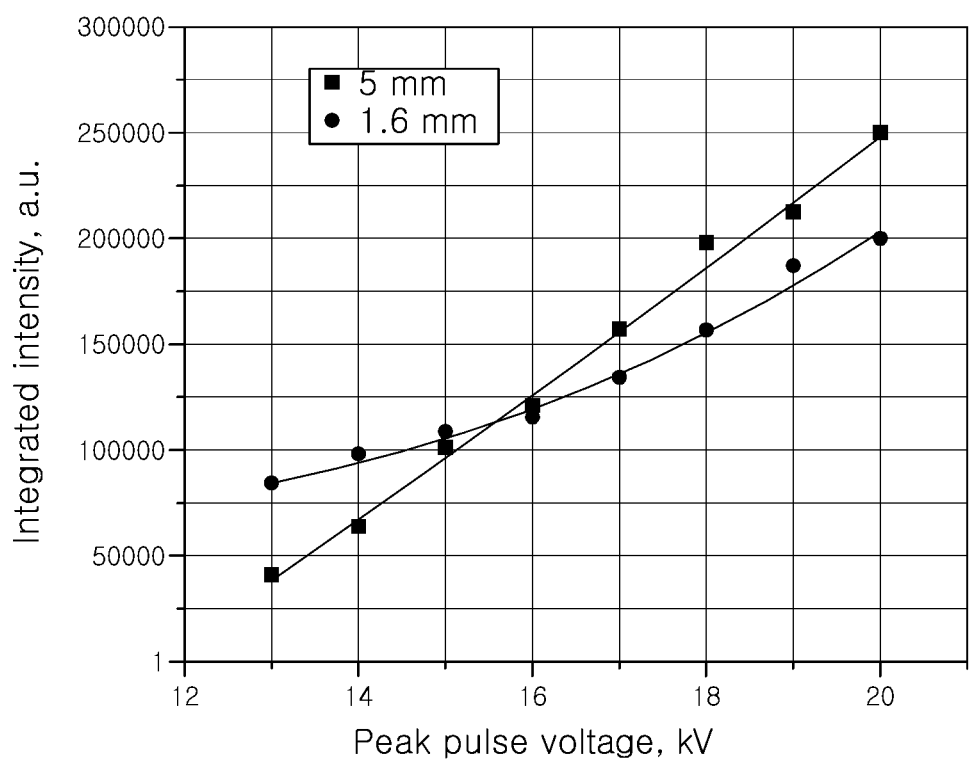

FIG. 5 illustrates a measurement of the electron density in the chemical liquid L, converted to the in-liquid plasma state through the above process, wherein the measured electron density refers to a density of charged particles formed in a process of forming a radical, a neutral particle. In embodiments, the chemical liquid may have an electron density of $10^{17}$ cm$^{-3}$ to $10^{18}$ cm$^{-3}$, and based on the above, compared to an election density ($\ll 10^3$ cm$^{-3}$) included in water (H$_2$O), it can be seen that very high concentrations of radicals may be formed in the chemical liquid L. FIG. 6 illustrates a graph measuring concentrations of generated radicals R, when a distance D2 (see FIG. 2) between the induction electrode 30 and the chemical liquid L is 5 mm and 1.6 mm, respectively.

As such, radicals R may be formed in the chemical liquid L converted to the in-liquid plasma state, to cause a decomposition reaction on the object immersed in the chemical liquid L. Therefore, the chemical liquid L converted to the in-liquid plasma state may be used to etch the surface of the immersed wafer W. When the etching process is performed using only the radicals R formed in the chemical liquid L, an isotropic etching reaction of the wafer W may be performed to generate an undercut such as in a wet etching process. In embodiments, the lower electrode 40 may be irradiated with the ion beam IB to impart etching directivity to the radicals R, such that the radicals R may undergo an anisotropic etching reaction in an extraction direction of the ion beam IB to control the etching directivity.

Figure 4:
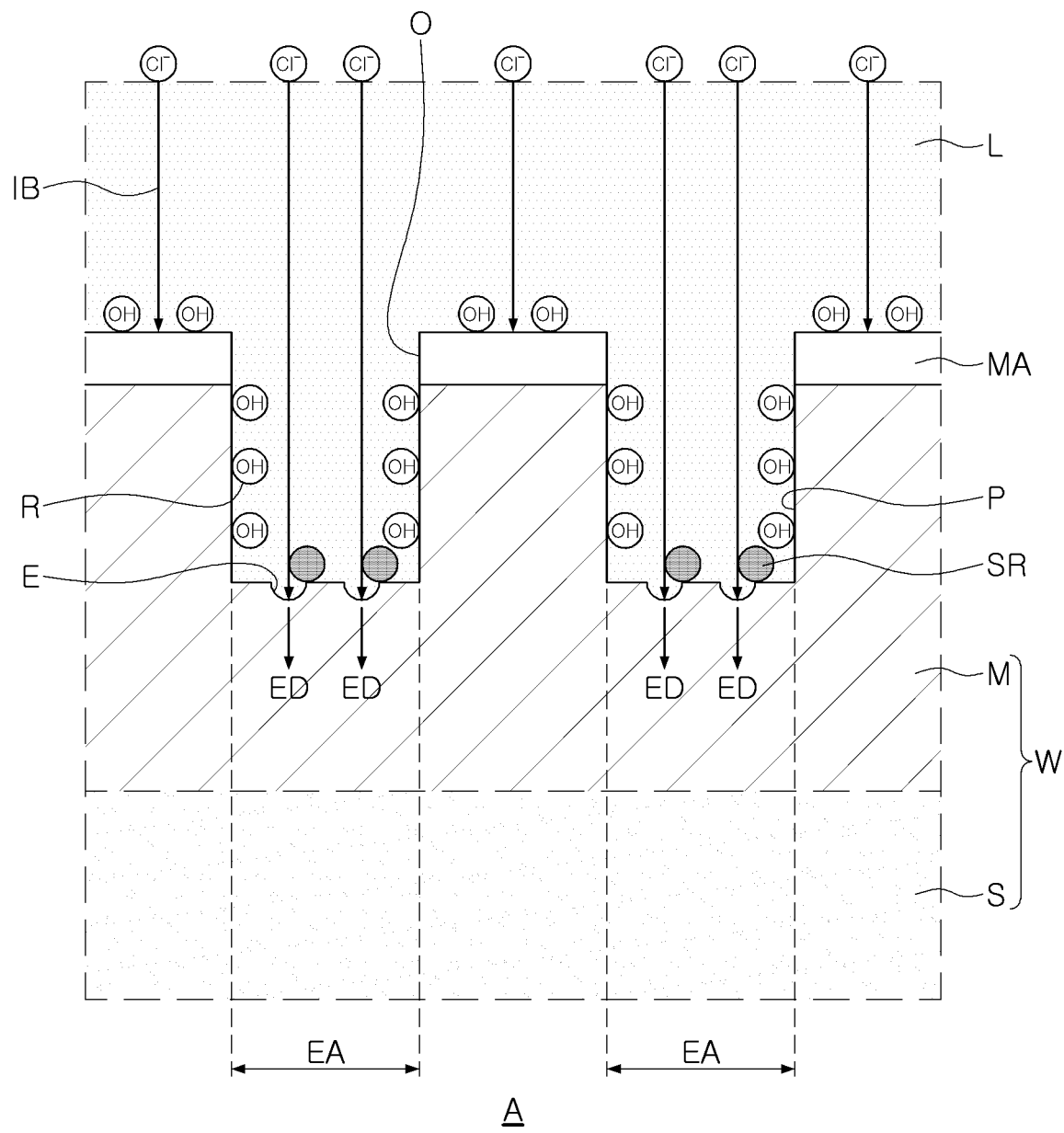
FIG. 4 is an enlarged view illustrating portion A of FIG. 2, and illustrates an etching process of a wafer using a substrate processing apparatus according to embodiments.

This will be described in detail, with reference to FIG. 4. The wafer W may include a semiconductor substrate S, and a metal layer M disposed on the semiconductor substrate S, and a mask MA having at least one opening O for defining an etching area EA may be formed on a surface of the metal layer M. The chemical liquid L may include any one or any combination of deionized (DI) water, a CuCl$_2$ solution, an FeCl$_3$ solution, and an HF solution. In embodiments, a case in which the metal layer M is copper (Cu) for forming a metal wiring, the ion of the ion beam IB is chlorine ion (Cl$^-$), the chemical liquid L is DI water, the radicals R formed by converting the chemical liquid L to an in-liquid plasma state are OH radicals will be described as an example.

In embodiments, the OH radicals R in the chemical liquid L may be attached to the metal layer M exposed from the etching area EA, corresponding to the at least one opening O of the mask MA, and the metal layer M may be etched by a chemical reaction as illustrated in the following Formula 1 to form a lower pattern P. Because Cu(OH)$_2$, which is an etching by-product SR, is not dissolved in water, it may be attached to the etching area EA when remaining, thereby reducing the etching rate. In embodiments, the ion beam IB may be irradiated to the chemical liquid L, to convert the etching by-product SR Cu(OH)$_2$ into a water-soluble material. Cl$^-$ ions of the irradiated ion beam IB may react with Cu(OH)$_2$ to form CuCl$_2$, by a chemical reaction as illustrated in Formula 2 below. Since CuCl$_2$ is a water-soluble substance, it may be dissolved in the chemical liquid L. Therefore, problems related to a lowered etching speed caused by the etching by-product SR may be solved.

$$Cu+2OH \rightarrow Cu(OH)_2 \qquad \text{[Formula 1]}$$

$$Cu(OH)_2+2Cl^- \rightarrow CuCl_2 \qquad \text{[Formula 2]}$$

In addition to the effect of converting the etching by-product SR into the water-soluble material, the ion beam IB may impart etching directivity ED to the OH radicals R. Although the ion beam IB is not irradiated, the OH radicals R may etch the metal layer M, but in this case, the OH radicals may allow the metal layer M to perform an isotropic etching reaction to a lower region of the mask MA to generate an undercut. When the ion beam IB of Cl$^-$ is irradiated in a normal direction of the mask MA from an upper portion, the etching directivity ED may be controlled such that the OH radicals R perform an anisotropic etching reaction E in the extraction direction of the ion beam IB.

Referring to FIGS. 1 and 2, the chemical liquid supply unit 50 for supplying the chemical liquid L may be further disposed on the lower electrode 40. The chemical liquid supply unit 50 may be connected to a chemical liquid supply source 70 to supply the chemical liquid L to the reservoir 42. After supplying the chemical liquid L from an upper portion of the lower electrode 40, the chemical liquid supply unit 50 may rotate to deviate from the extraction direction of the ion beam IB. Therefore, it may prevent the ion beam IB from being blocked by the chemical liquid supply unit 50.

Figure 7:
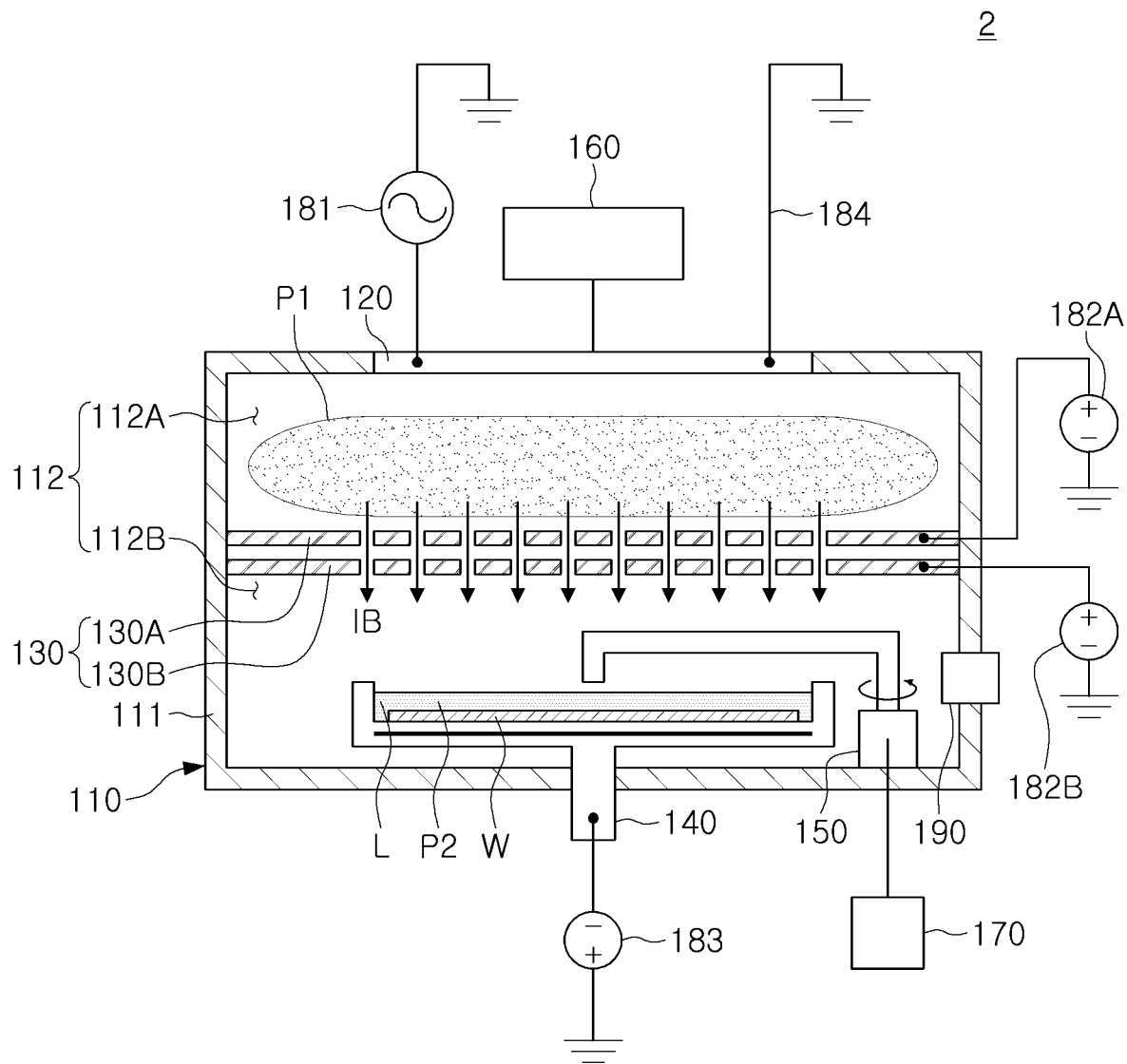
FIG. 7 is a view schematically illustrating a substrate processing apparatus according to embodiments.

Referring to FIG. 7, a substrate processing apparatus 2 according to embodiments will be described. In embodiments, substrate processing apparatus 2 may differ from substrate processing apparatus 1 of FIG. 1 in that, in substrate processing apparatus 2, an induction electrode 130 may include a first grid 130A and a second grid 130B. An example in which the induction electrode 130 includes the two grids has been described, but embodiments are not limited thereto, and some embodiments may include three or more grids. In embodiments, because the induction electrode 130 includes the first grid 130A and the second grid 130B, each of the grids may adjust characteristics of the ion beam. For example, the first grid 130A may extract and accelerate ions from plasma P1, and the second grid 130B may concentrate the ion beam. Through-holes respectively formed in the first grid 130A and the second grid 130B may be arranged to be aligned with each other in a direction to which ions are extracted. The first grid 130A and the second grid 130B may be connected to different power supplies or ground electrodes, respectively. In embodiments, the first grid 130A and the second grid 130B may be connected to separate second power supplies 182A and 182B, respectively. The substrate processing apparatus 2 according to embodiments may include a processing chamber 110 having an internal space 112 formed by an external wall 111. An upper electrode 120 may be disposed in a first internal space 112A, an upper portion of the internal space 112, and a lower electrode 140 may be disposed in a second internal space 112B, a lower portion of the internal space 112. The first internal space 112A and the second internal space 112B may be divided by the induction electrode 130.

The first internal space 112A may be used as a space for generating the plasma P1 in the process gas supplied from a process gas source 160 to form the ion beam IB. The second internal space 112B may be used as a space for converting the chemical liquid L in which the wafer W is immersed into an in-liquid plasma P2 state, and irradiating the ion beam IB formed by the plasma P1 to etch the wafer W.

A chemical liquid supply unit 150 and a chemical liquid supply source 170 for supplying chemical liquid to the lower electrode 140 may be included. In addition, the substrate processing apparatus 2 may include a first power supply unit 181 a third power supply unit 183. and a ground electrode 184. In one region of the external wall 111, a pump 190 for exhausting gas in the internal space 112 may be disposed.

Figure 8:
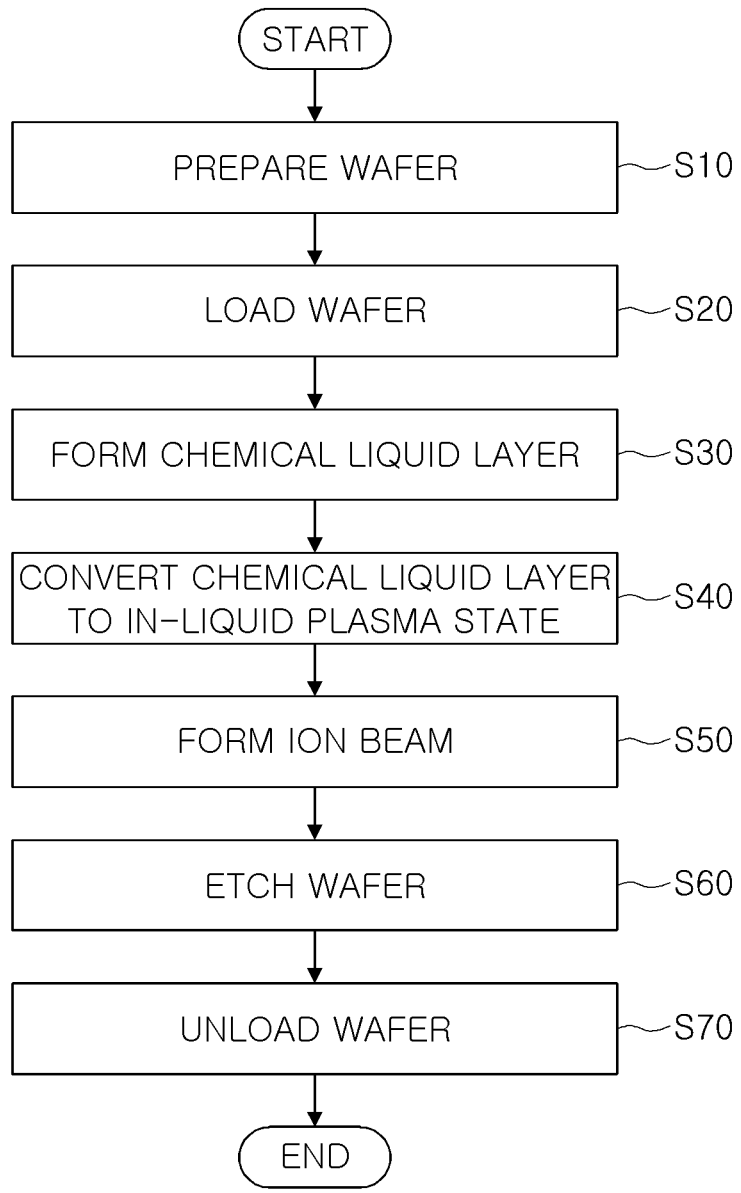
FIG. 8 is a flowchart illustrating a method of forming a semiconductor device according to embodiments.

Referring to FIGS. 8 to 13, a method of forming a semiconductor device using the substrate processing apparatus 1 of FIG. 1 described above will be described. FIG. 8 is a flowchart illustrating a method of forming a semiconductor device according to embodiments, and FIGS. 9 to 13 are views illustrating a method of forming a semiconductor device according to embodiments.

Figure 11:
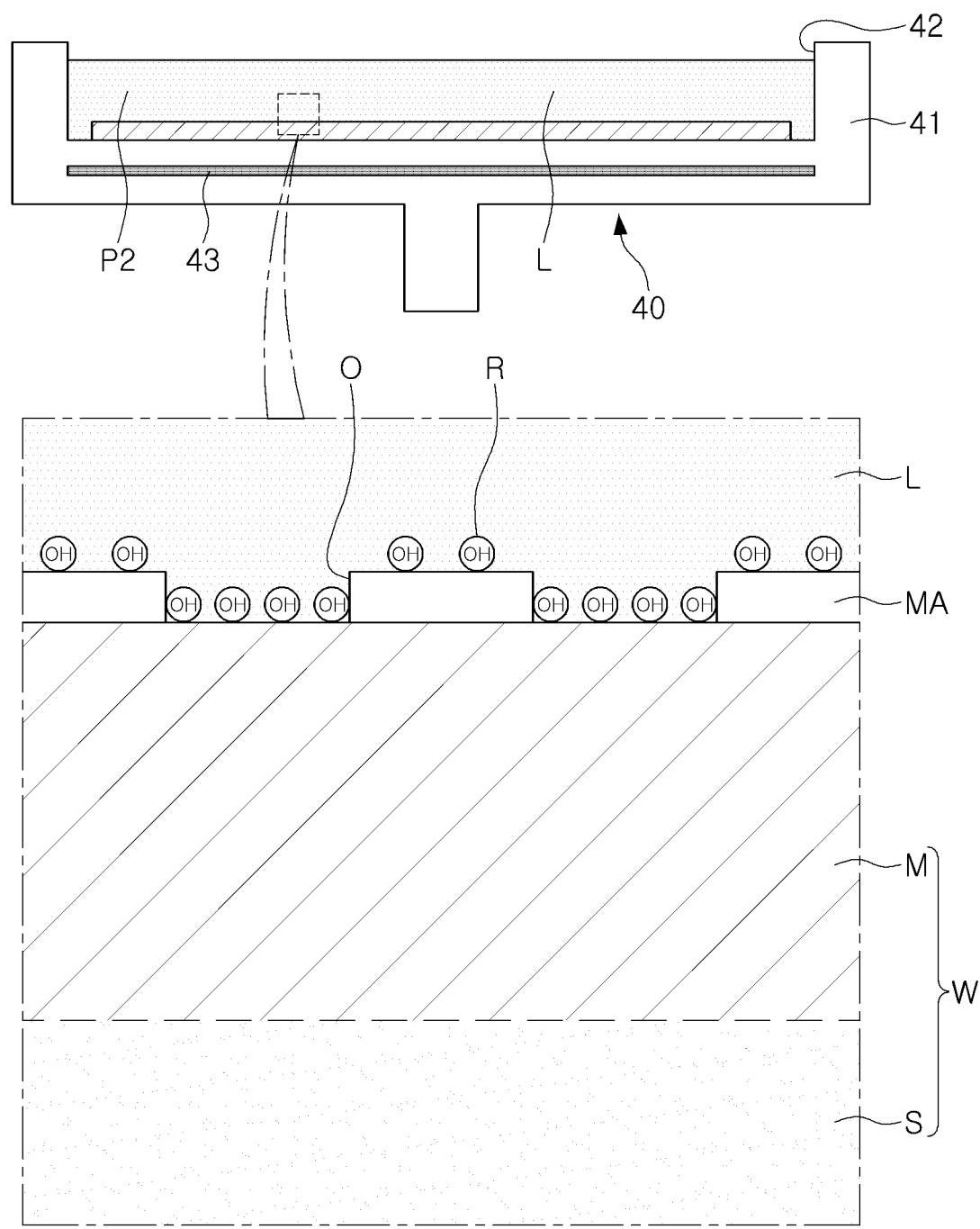

First, in a substrate processing apparatus, at operation S10 a semiconductor substrate S to be etched may be formed, a metal layer M made of a metal material such as copper (Cu) may be formed on a surface of the semiconductor substrate S, as a lower layer, and then a mask MA having at least one opening O may be formed on the metal layer M, to prepare a wafer W. FIG. 11 illustrates an example of this operation.

Figure 9:
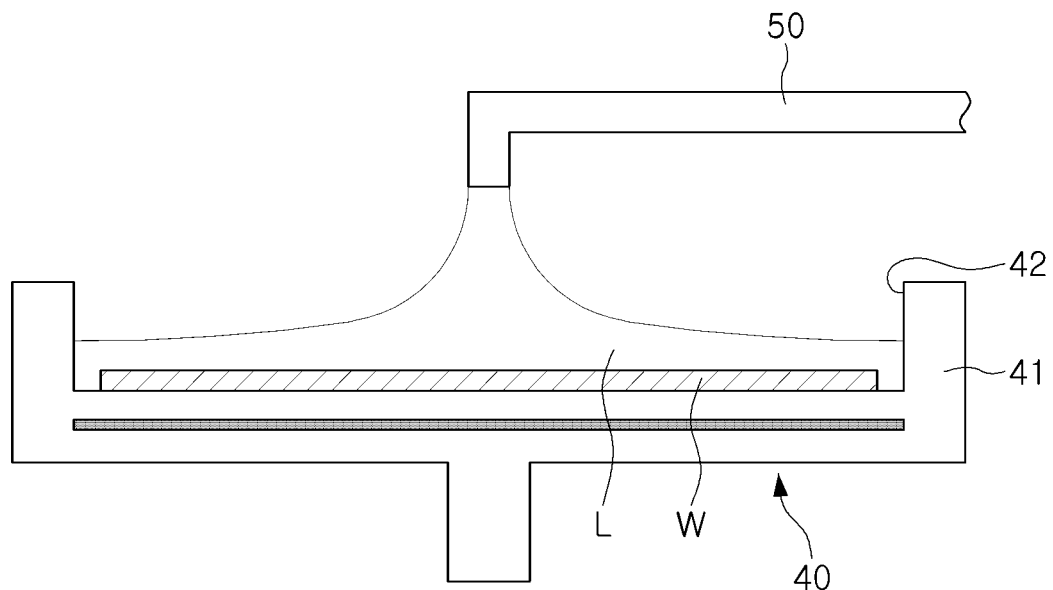
FIGS. 9 to 14 are views illustrating a method of forming a semiconductor device according to embodiments.

Next, referring to FIG. 9, at operation S20 the wafer W may be loaded into a reservoir 42 of a chuck, which may Ire a lower electrode 40, and at operation S30 a chemical liquid layer may be formed on the wafer W. Chemical liquid L may be supplied to the reservoir 42 by a chemical liquid supply unit 50, to immerse the wafer W in the chemical liquid L. The chemical liquid may be supplied to the extent that an upper surface of the wafer W is covered. The chemical liquid L may be any one or any combination of DI water, a $CuCl_2$ solution, an $FeCl_3$ solution, and an HF solution. In embodiments, a case of using pure water as the chemical liquid L as an example will be described.

Figure 10:
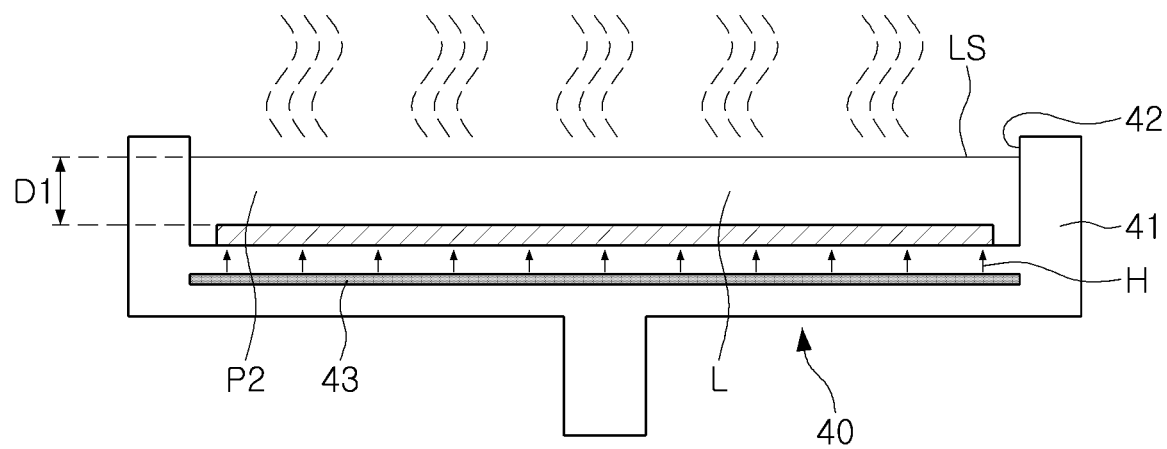

According to embodiments, as illustrated in FIG. 10, the chemical liquid L may be heated by a heater 43 disposed below the reservoir 42, to accelerate vaporization generated from a surface LS of the chemical liquid L. Therefore, a depth D1 in which the upper surface of the wafer W is immersed may be controlled.

Next, as illustrated in FIG. 11, at operation S40, nanopulses may be applied to the chemical liquid L received in the reservoir 42 by the lower electrode 40, to convert the chemical liquid L into an in-liquid plasma state. In this operation, OH radicals R may be formed in the chemical liquid L.

Figure 12:
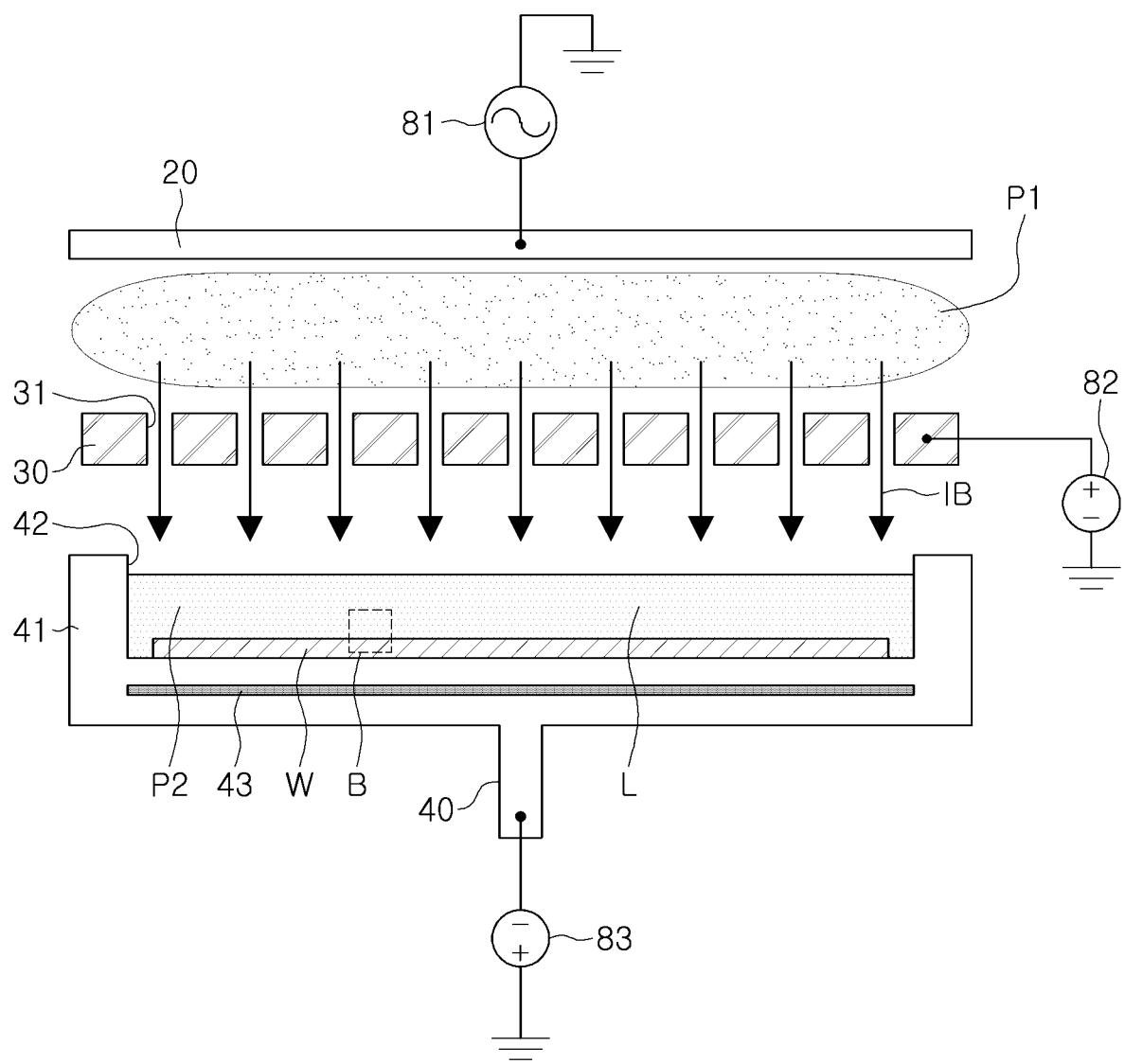
Figure 13:
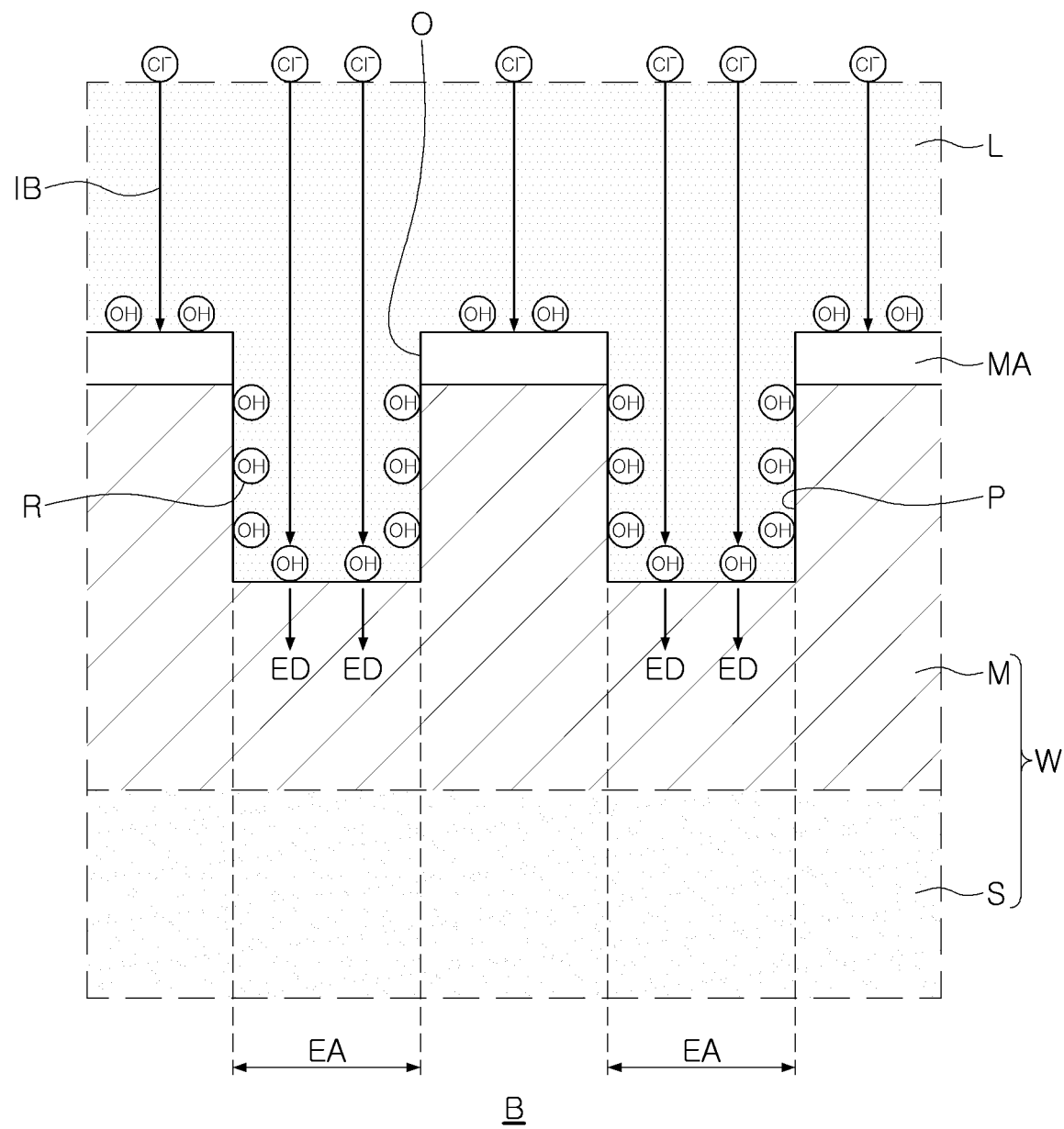

Next, as illustrated in FIG. 12, at operation S50 a process gas may be supplied to a first internal space 12A, an upper electrode 20 and the lower electrode 40 may be used to generate plasma P1 in the process gas, and an ion beam IB may be extracted from the plasma P1 and may be irradiated to the reservoir 42 of the lower electrode 40. Referring to FIG. 13, which is an enlarged view illustrating portion B of FIG. 12, the ion beam IB irradiated from the plasma P1 may impart the same etching directivity ED, as an extraction direction of the ion beam IB, to the OH radicals R formed in the chemical liquid L. Although the ion beam IB has been described as being irradiated after the formation of the radicals R in the chemical liquid L, embodiments are not limited thereto. In some embodiments, the extraction of the ion beam IB and the formation of the radicals R may be simultaneously performed, and the radicals R may be also formed after the ion beam IB is irradiated. At operation S60, OH radicals R imparted with the etching directivity ED may perform an anisotropic etching reaction to the metal layer M of the wafer W.

Figure 14:
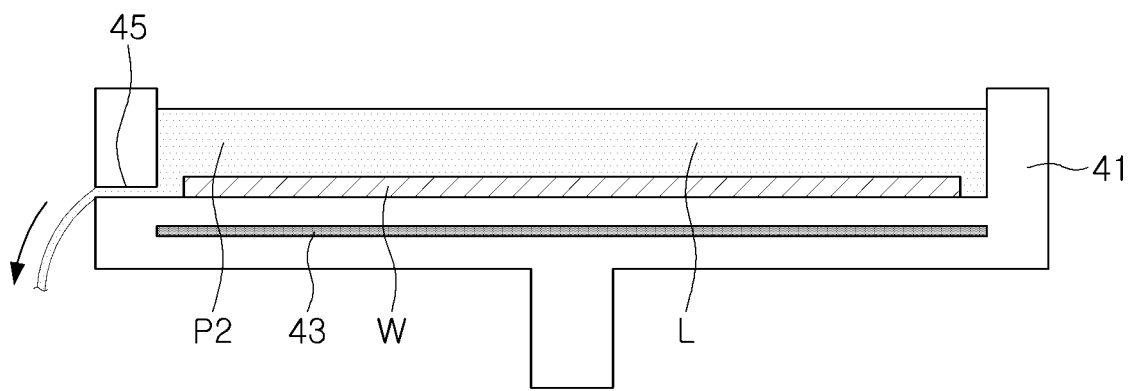

Next, when the etching operation is completed, as illustrated in FIG. 14, at operation S70 the chemical liquid L may be discharged from the reservoir 42 through the drainage passage 45, and the wafer W may be unloaded from the lower electrode 40. Thereafter, a process for manufacturing a semiconductor device may be performed by processing the wafer W. In some embodiments, an operation of cleaning or drying the wafer W may be further performed, before the unloading of the wafer W.

According to embodiments, the substrate processing apparatus may simultaneously provide relatively fast etching speed and ease of removal of etching by-products, the advantages of the wet etching process, while performing an anisotropic etching reaction, the advantage of the dry etching process.

Various and advantageous advantages and effects of the present disclosure are not limited to the above description, and can be more readily understood in the course of describing specific embodiments.

While example embodiments have been illustrated and described above, it will be apparent to those skilled in the art that modifications and variations could be made without departing from the scope as defined by the appended claims.

What is claimed is:

1. A substrate processing apparatus comprising:
    a processing chamber including a first internal space and a second internal space arranged in a vertical direction with respect to the first internal space, wherein the first internal space is configured to receive process gas to generate plasma;
    an induction electrode configured to divide the processing chamber into the first internal space and the second internal space, and having a plurality of through-holes arranged to connect the first internal space and the second internal space, wherein the plurality of through-holes are configured to induce an ion beam extracted from ions included in the plasma generated in the first internal space;
    a radical supply located in the second internal space, and including a reservoir configured to receive chemical liquid in which an object to be processed is immersed, and a lower electrode, configured to apply nanopulses to the reservoir to generate radicals from the chemical liquid; and
    a chemical liquid supply configured to supply the chemical liquid to the reservoir.

2. The substrate processing apparatus according to claim 1, wherein the object comprises:
    a semiconductor substrate;
    a metal layer disposed on the semiconductor substrate; and
    a mask disposed on the metal layer and having at least one opening, and
    wherein the metal layer is exposed through the at least one opening such that the radicals etch the metal layer.

3. The substrate processing apparatus according to claim 2, wherein the induction electrode comprises a grid configured to induce the ion beam from the plasma and to impart etching directivity for the radicals to perform an anisotropic etching reaction in an extraction direction of the ion beam.

4. The substrate processing apparatus according to claim 1, wherein the radicals perform an anisotropic etching reaction in an extraction direction of the ion beam.

5. The substrate processing apparatus according to claim 1, wherein the chemical liquid comprises at least one of deionized (DI) water, a $CuCl_2$ solution, an $FeCl_3$ solution, and an HF solution.

6. The substrate, processing apparatus according to claim 1, wherein the process gas comprises an HCl gas, and
the radicals are OH radicals.

7. The substrate processing apparatus according to claim 1, wherein the radical supply further comprises a heater configured to heat the chemical liquid, disposed in a lower portion of the reservoir.

8. The substrate processing apparatus according to claim 1, wherein a first direct current power having a first polarity is applied to the induction electrode, and
wherein a second direct current power having a second polarity different from the first polarity is applied to the radical supply.

9. The substrate processing apparatus according to claim 1, wherein the chemical liquid supply is configured to supply the chemical liquid to the reservoir, and to rotate to deviate from an extraction direction of the ion beam.

10. The substrate processing apparatus according to claim 1, further comprising a drainage passage disposed in the radical supply, and configured to discharge the chemical liquid included in the reservoir.

11. A substrate processing apparatus comprising:
a processing chamber including a first internal space and a second internal space disposed below the first internal space, wherein the first internal space is configured to generate plasma;
an ion beam supply including an induction electrode disposed to divide the processing chamber into the first internal space and the second internal space, wherein the induction electrode includes a plurality of through-holes configured to induce an ion beam extracted from the plasma to irradiate the second internal space; and
a radical supply including a reservoir disposed in the second internal space and configured to receive chemical liquid, and a lower electrode configured to apply nanopulses to the reservoir to convert the chemical liquid into an in-liquid plasma state.

12. The substrate processing apparatus according to claim 11, wherein the radical supply comprises:
a chuck located in the processing chamber, wherein the reservoir is disposed on an upper surface the chuck; and
a pulse supply unit configured to apply the nanopulses to the chuck, and
wherein the nanopulses have a period of 0.01 kHz to 100 kHz.

13. A substrate processing apparatus comprising:
a plasma generator configured to generate plasma in a processing chamber;
an ion beam supply configured to extract an ion beam from the plasma in the processing chamber; and
a radical supply configured to:
apply nanopulses to a chemical liquid in which an object is immersed to convert the chemical liquid into an in-liquid plasma state containing ions and radicals,
position a reservoir configured to receive the chemical liquid to face the ion beam supply, and
impart an etching directivity for the radicals to perform an anisotropic etching reaction of the object in as extraction direction of the ion beam.

14. The substrate processing apparatus according to claim 13, wherein the ion beam supply comprises:
a grid configured to induce the ion beam from the plasma; and
a direct current power supply configured to apply direct current power to the grid.

15. The substrate processing apparatus according to claim 14, wherein the grid comprises a plurality of grids including a first grid and a second grid,
wherein the first grid is disposed to face the second grid in the extraction direction.

16. The substrate processing apparatus according to claim 14, wherein the grid comprises at least one of tungsten, aluminum, copper, molybdenum, stainless steel, and carbon.

17. The substrate processing apparatus according to claim 13, wherein the radical supply comprises:
a chuck located in the processing chamber, wherein the reservoir is disposed on an upper surface of the chuck; and
a pulse supply unit configured to apply the nanopulses to the chuck.

18. The substrate, processing apparatus according to claim 13, wherein the nanopulses have a period of 0.01 kHz to 100 kHz.

19. The substrate processing apparatus according to claim 13, wherein the object comprises:
a semiconductor substrate;
a metal layer disposed on the semiconductor substrate; and
a mask disposed on the metal layer and having at least one opening,
wherein the metal layer is exposed through the at least one opening such that the radicals etch the metal layer.

20. The substrate processing apparatus according to claim 19,
wherein the metal layer comprises a metal material including copper,
wherein the ion beam comprises chlorine ions (Cl−),
wherein the chemical liquid is deionized (DI) water, and
wherein the radicals are OH radicals.

* * * * *